April 7, 1970 H. OTTESEN 3,505,668

BIPOLAR ANALOG TO DIGITAL CONVERTER

Filed June 1, 1965 2 Sheets-Sheet 1

INVENTOR.
HJALMAR OTTESEN

BY Elmer Galbiati

ATTORNEY 3,505,668
Patented Apr. 7, 1970

3,505,668

BIPOLAR ANALOG TO DIGITAL CONVERTER

Hjalmar Ottesen, Los Gatos, Calif., assignor to International Business Machines Corporation, Armonk, N.Y., a corporation of New York Filed June 1, 1965, Ser. No. 460,431
Int. Cl. H03k *13/14*
U.S. Cl. 340—347 4 Claims

ABSTRACT OF THE DISCLOSURE

A bipolar successive approximation type of analog to digital converter which merely includes one precision power supply: a successive approximation type of analog to digital converter includes a digital to analog converter, a comparator and sequencing logic for changing the value being converted from a digital number to an analog number. The digital to analog converter of necessity includes a reference source. With the present invention, bipolar operation utilizing a single reference source is accomplished by comparing the voltage at the output of said digital to analog converter to a signal which is responsive to the same power source that generates the reference signal for the digital to analog converter.

The present invention relates to electronic circuitry and more particularly to circuitry for converting analog signals to digital signals.

The art of converting analog signals to digital signals is well developed and there are a large number of different types of analog to digital converters shown in the prior art. One type of analog to digital converter shown in the prior art is termed a successive approximation type of converter. This type of converter includes a register for storing a digital number and a digital to analog converter whereby an analog signal representative of the digital number stored in a register is generated. The input analog signal is compared to the analog signal generated by the digital to analog converter and if the two signals are not within a certain range the number stored in the digital register is changed thereby changing the magnitude of the signal generated by the digital to analog converter. The procedure of comparing the output of the digital to analog converter to the input signal and changing the number stored in the digital register if the two are not within a certain range proceeds (by successive approximation) until the signal generated by the digital to analog converter is substantially equal to the input signal. At this point, the number stored in the register represents the magnitude of the input signal. An important fact is that the digital to analog converter in a successive approximation type of analog to digital converter generally requires a reference source of current or voltage that has a polarity opposite to the polarity of the analog input signal.

There are several techniques for converting bipolar inputs using a successive approximation type of analog to digital converter. One technique involves using a double pole, single throw reversing switch whereby the input connections are reversed when the input voltage is negative. A system using this technique is shown in U.S. Patent 2,892,186. This type of system is severely limited in that it is not applicable to what is termed single ended inputs. In a system that includes single ended inputs only one line is available and the input voltage appears between this line and the system ground. In such systems it is not possible to use the reversing switch technique of handling bipolar inputs.

Another technique shown in the art utilizes two sets of reference sources for the ladder network in the digital to analog converter. One set of sources is used to convert positive inputs and the other set of sources is used to convert negative inputs. A system that utilizes this technique is shown in U.S. Patent 3,092,824. One severe disadvantage of this type of system is cost in that it requires either two precision power supplies, one that provides a positive reference and one that provides a negative reference, or it requires one precision power supply that provides both a positive reference and a negative reference.

Still another technique used to handle bipolar inputs involves selectively applying an appropriately poled bias to the summing junction. This type of system merely requires one set of reference sources for the ladder network; however, the polarity of the bias must be opposite to the polarity of the reference sources. An example of a system that utilizes this technique is shown in co-pending application entitled "Bipolar Digital to Analog Converter," Ser. No. 420,879 filed Dec. 24, 1964 by David H. Skrenes now Patent 3,403,393 that is assigned to the assignee of the present invention. This type of analog to digital converter has the same disadvantage as the previously mentioned type in that it requires two power supplies, one having a positive output and one having a negative output.

With commercial analog to digital converters utilized in data processing equipment, a substantial portion (in the neighborhood of twenty or thirty percent) of the cost of the analog to digital converter consists of the cost of the power supply in the analog to digital converter. The provision of two power supplies of opposite potential (or of one power supply that has both a positive and a negative output) involves a substantial increase in the cost of the analog to digital converter. For example, a precision power supply that has both a positive and a negative output costs more than one and a half times as much as a power supply that only has a positive output.

The present invention provides a bipolar analog to digital converter of the successive approximation type which has only one unipolar precision power supply. This results in a substantial saving in overall product cost. Furthermore, the present invention increases the accuracy, stability and linearity of the analog to digital converter.

An object of the present invention is therefore to provide an improved analog to digital converter.

Yet another object of the present invention is to provide an improved bipolar analog to digital converter.

Still a further object of the present invention is to provide a low cost high precision bipolar analog to digital converter.

A still further object of the present invention is to provide a bipolar analog to digital converter of the successive approximation type which merely requires one precision power supply.

A still further object of the present invention is to provide a bipolar analog to digital converter which merely requires one precision power supply and which has a high degree of accuracy, stability and linearity.

The foregoing and other objects, features and advantages of the invention will be apparent from the following more particular description of preferred embodiments of the invention.

Figure 1:
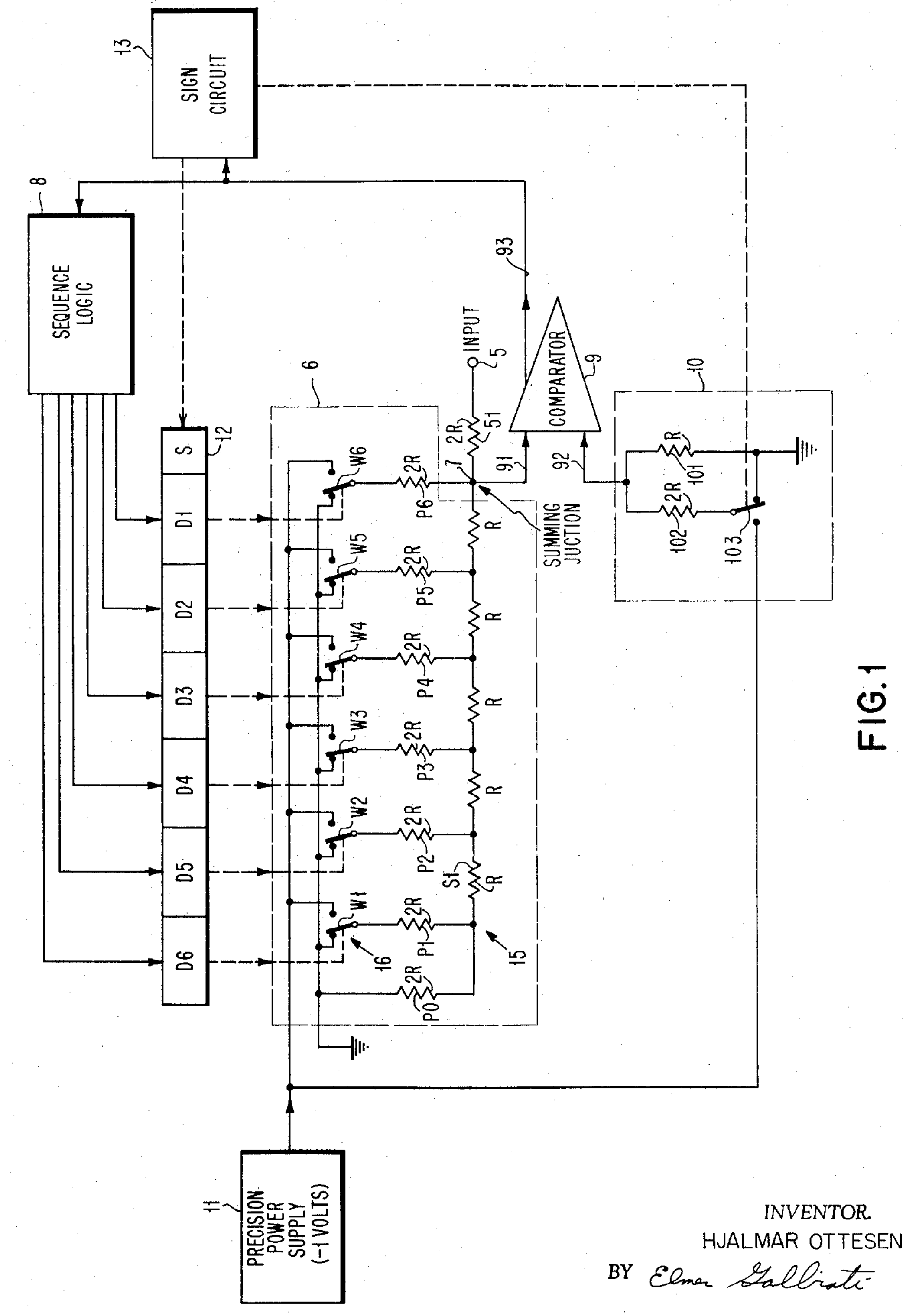
FIGURE 1 shows an overall schematic diagram of a first preferred embodiment of the present invention.

The major components in the system shown in FIGURE 1 include an analog signal input 5, a digital to analog converter 6, a summing junction 7, digital sequencing logic 8, a comparator 9, comparator input circuit 10, precision power supply 11, digital register 12 and sign circuitry 13. In general, the system operates as follows: The analog voltage from input 5 is applied to summing junction 7. A second analog voltage generated by digital to analog converter 6 is also applied to summing junction 7. The comparator 9 compares the resulting voltage at summing junction 7 to the voltage generated by circuit 10. If the comparator 9 indicates that the voltage generated by circuit 10 is not equal to the voltage at summing junction 7, the comparator signals sequencing logic 8 which changes the digital value stored in register 12, thus changing the analog voltage that digital to analog converter 6 applies to summing junction 7. This procedure continues (by successive approximation) until the analog voltage generated by digital to analog converter 6 summed with the analog input voltage from terminal 5 substantially equals the reference voltage generated by reference circuit 10. When the analog voltage generated by digital to analog converter 6 equal the voltage from terminal 5, the digital number in register 12 indicates the magnitude of the analog signal applied to input terminal 5.

As will be explained in detail later, when a positive analog voltage is applied to terminal 5 the number in register 12 at the end of the conversion is the binary number that represents the magnitude of the input voltage; however, when a negative input voltage is applied to input 5, the binary number in register 12 at the end of the conversion represents the two's complement of the binary number that represents the magnitude of the analog input signal. Register 12 has a sign bit or location (designated S on the drawing) that is set to indicate whether the signal applied to the input terminal 5 is positive or negative.

The main feature of the present invention, as illustrated in the particular embodiment shown, is the fact that comparator 9 compares the voltage at summing junction 7 to ground potential when positive analog input voltage is applied to input terminal 5 and comparator 9 compares the voltage at summing junction 7 to a negative voltage when a negative analog input voltage is applied to terminal 5. As a result, bipolar inputs can be handled yet the system only has a single unipolar precision power supply 11. The details of the various units in the system will be explained next and then the details of the operation of the system will be explained.

The digital to analog converter 6 includes a ladder network 15 and a plurality of ladder network switches 16. Switches 16 are individually designated W1 to W6. The ladder network 15 is a conventional binary ladder that includes a plurality of series arms having a resistance R and a plurality of parallel legs having a resistance of 2R. The series resistors are respectively designated S1 to S5 and the parallel legs are respectively designated P0 to P6. The switches 16 connect the various parallel legs of the ladder network to either ground or to the precision power supply 11. Each switch W1 to W6 is a single throw, double pole switch. One pole of each switch is connected to precision power supply 11 and the second pole of each switch is connected to a ground terminal. Thus, each leg in the ladder network 15 is either connected to ground or to precision power supply 11.

The principle of operation of digital to analog converters that utilize ladder networks is well known. Briefly, digital to analog converter 6 operates in the following manner. The voltage applied between summing junction 7 and ground by digital to analog converter 6 is a function of the state of switches W1 to W6. The voltage applied to summing junction 7 by moving switch W5 from the ground position to the power supply position is one half of the voltage applied to summing junction 7 by moving switch W6 from the ground position to the power supply position. In general, each switch has one half the effect of the preceding switch (starting at switch W6). A ONE stored in a particular position of register 12 causes the associated switch to move from the ground position to the power supply position. The circuitry for actuating switches 16 from register 12 and the details of switch 16 is not shown since these details are not relevant to the present invention and since such circuitry is well known. For example, see the co-pending application filed June 6, 1961 by Howard Funk et al., Ser. No. 115,113, that is assigned to the assignee of the present invention. Since the effect of each switch is one half the effect of the preceding switch, the number stored in register 12 that controls the operation of switches 16 is the binary representative of the analog voltage applied to summing junction 7 by the digital to analog converter 6.

The voltage at summing junction 7 is the sum of the voltage applied to summing junction 7 by analog to digital converter 6 and the voltage applied to summing junction 7 from input terminal 5. A scaling resistor 51 is connected between terminal 5 and summing junction 7. The magnitude of resistor 51 is equal to the magnitude of the resistors P1 to P6 in the legs of ladder network 15. The presence of scaling resistor 51 allows the system to handle higher voltage input signals because the voltage applied to summing junction 7 due to a voltage applied to input 5 is reduced by resistor 51. As previously indicated, comparator 9 compares the voltage at summing junction 7 to the voltage generated by circuit 10. Circuit 10 generates a reference signal of substantially ZERO volts when a positive signal is applied at input 5. When a negative signal is applied at input 5, reference circuit 10 generates a negative reference signal.

Reference circuit 10 includes two resistor 101 and 102 and a double pole, single throw switch 103. Resistor 101 has a value of R and it connects the reference terminal to ground. Resistor 102 has a value of 2R and it connects the reference terminal to switch 103. Switch 103 connects resistor 102 to ground or to the output of precision power supply 11.

Comparator 4 has a high input impedance; hence, circuit 10 supplies only a very small amount of current. For example, it might merely supply the base current for a transistor at the input stage of comparator 9. Hence, when switch 103 is connected to ground, circuit 10 applies a signal of substantially ZERO volts to input 92 of comparator 9 and when switch 103 is connected to power supply 11, circuit 10 applies approximately minus one third volt to input 92 of comparator 9.

The comparator 9 is a noninverting differential comparator with a high input impedance. If the voltage appearing between terminals 91 and 92 has a polarity such that terminal 91 is more positive than terminal 92, a positive voltage appears on output line 93. If, on the other hand, either no voltage or a voltage such that terminal 92 is more positive than terminal 91 is applied to the input of comparator 9, no voltage appears on output line 93. (Output 93 is clamped to ZERO for negative voltages.)

Sequencing logic 8 is conventional sequencing logic for a successive approximation type of digital to analog converter. Its function is to change the number in register 12 until comparator 9 indicates that the voltage at summing junction 7 substantially equals the voltage generated by circuit 10. Such logic is, for example, shown in application Ser. No. 115,112, filed June 6, 1961 by Howard Funk et al. now Patent 3,216,003 which is assigned to the assignee of the present invention. Alternately, the present system could be manually stepped through its sequence of operations.

Sign circuitry 13 responds to the output of comparator 9 during one particular part of the cycle of the operation of the system. The part of the cycle during which circuit 13 is operative will be explained in detail later. If sign circuitry 13 detects a ZERO output from comparator 9 at this particular time, the circuitry sets the S bit in register 12 to the ONE state and it changes switch 103 from the ground position to the power supply position. Such circuitry is entirely conventional and hence, is not shown in detail herein. For convenience in writing binary numbers, the S bit is written to the left of the highest order binary bit and bits D1 to D6 are written with the highest order bit D1 to the left as is conventional.

For convenience in the following discussion and in FIGURES 2 and 3, the value of the voltages at summing junction 7 are referred to input 5. In effect, this means that the numbers used in the following discussion to describe the value of the voltages at summing junction 7 are three times larger than the numbers which represent the magnitude of the voltages at the summing junction when these voltages were measured from the summing junction directly to ground potential. Likewise, in the following discussion, the value of voltages on input 92 of comparator 9 are given with respect to switch 103. Thus, the numbers used to represent the reference voltages in the following discussion and in FIGURES 2 and 3 are, in effect, three times larger than the actual magnitude of the voltages at input 92 when these voltages are measured with respect to ground potential.

The actual magnitude of the various resistors is not particularly relevant to the present invention. Their value is an engineering design compromise that must be decided upon in accordance with the required value of input impedance needed at terminal 5 and in accordance with the allowable output impedance for power supply 11 and the allowable input impedance of comparator 9. For example, the resistor designated R could be 5000 ohms each and the resistor designated 2R would then have a value of 10,000 ohms each. The actual magnitude of the output of power supply 11 is likewise not relevant to the present invention. However, with resistors having the values shown, the maximum range of the system is equal to the magnitude of the voltage generated by power supply 11. For example, in the specific example shown herein the voltage generated by power supply 11 is a minus one volt; hence, the range of the system is from plus one volt to minus one volt. This can be understood from the following considerations. Changing switch W6 from the ground position to power supply 11 will apply a negative potential of 0.5 volt (referred to input 5) to summing junction 7, changing switch W5 from ground to power supply 11 will apply a negative potential of 0.25 volt to summing junction 7. Thus, if all of the switches W1 to W6 are connected to power supply 11 a potential equal to −0.5, −0.25, −0.125, −0.0625, −0.3125, −0.0156, or approximately minus one volt will be applied to summing junction 7. With an input of plus one volt and with circuit 10 supplying a reference of zero volts, comparator 9 will generate an output (N.B. due to the fact that line 91 will be positive relative to line 92) until all of the switches 16 are connected to power supply 11. Hence, any input voltage greater than plus one volt will not be registered. (Actually the highest number registered will be the binary number 0111111 rather than the binary number 1000000). With a negative input slightly less than zero the reference voltage will be minus one volt (referred to switch 103) and again comparator 9 will give an output (line 91 will be positive relative to line 92) until all of the switches 16 are connected to the negative supply. With all of the switches connected to supply 11 the number 1111111 is stored in register 12. As indicated for negative numbers the value ultimately stored in register 12 is the two's complement of the value of the input and 1111111 is the two's complement of the number 0000000.

Figure 3:
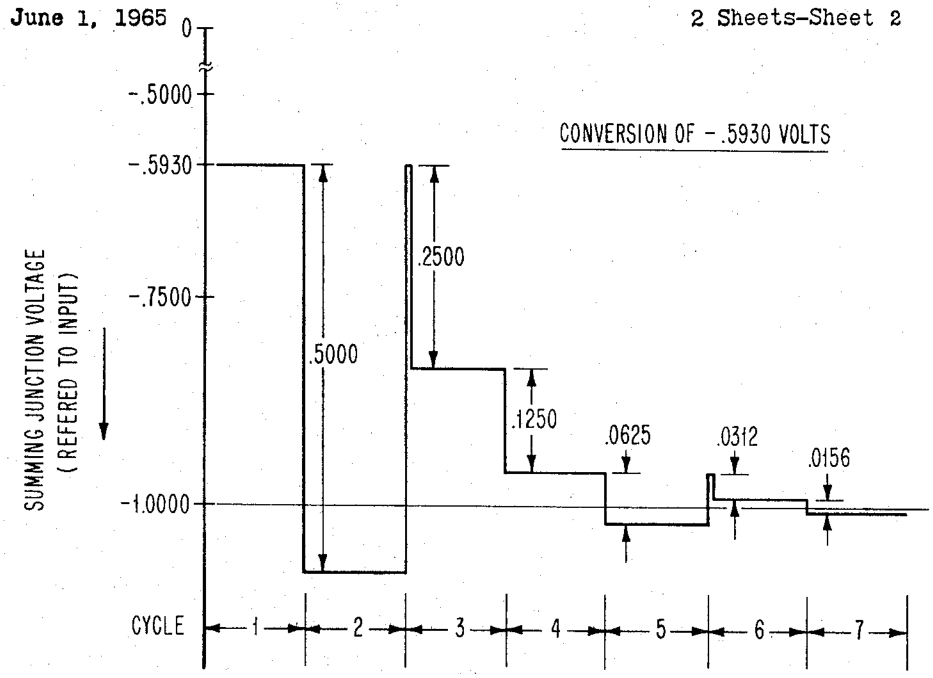
FIGURE 3 is a chart showing the conversion of a negative input.
Figure 2:
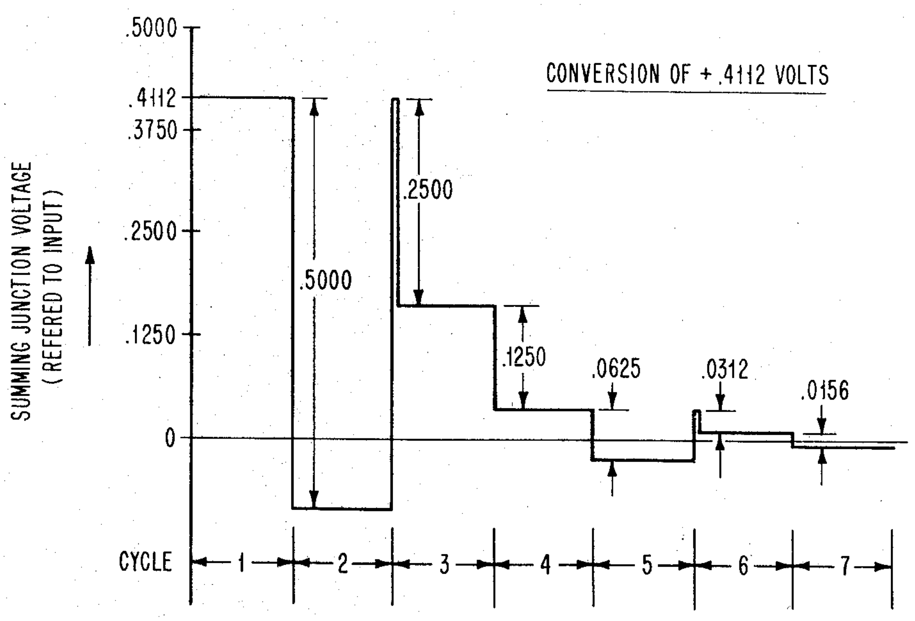
FIGURE 2 is a chart showing the conversion of a positive input.

The sequence of operation of the system can best be understood by reference to FIGURES 2 and 3. FIGURE 2 shows the sequence of operation during the conversion of a positive number and FIGURE 3 shows the sequence of operation during the conversion of a negative number. In general, the sequence of operation proceeds as follows: Initially, all of the positions of register 12 are set to the ZERO state so that all of the switches 16 are connected to the ground position. Likewise, switch 103 is initially connected to the ground position, thus circuit 10 initially generates a reference voltage of zero volts.

The conversion operation takes place in seven cycles as shown in FIGURES 2 and 3. During the first cycle of the conversion operation the sign of the analog input signal applied to terminal 5 is determined and during the remaining six cycles of the conversion operation the magnitude of the input signal is determined. As previously explained, comparator 9 determines whether the signal on line 91 is more positive than the signal on line 92. If the signal on line 91 is more positive than the signal on line 92, comparator 9 activates output line 93.

The operation of the system during the conversion of a positive input signal having a magnitude of +0.4112 volt will first be explained with reference to FIGURE 2 and later the operation of the system during the conversion of a negative input will be explained with reference to FIGURE 3. When a positive input signal is applied to terminal 5, line 91 is more positive than line 92 during cycle 1, and, hence, comparator 9 (non-inverting) produces a positive output on line 93 and sign circuitry 13 takes no action. Thus, switch 103 remains set to the ground position and the S bit in register 12 remains set to the ZERO state. (Note that all the voltages in the discussion to follow are referred to the input 5.)

At the end of cycle 1, sequencing logic 8 stores a one in the D1 position of register 12 thereby changing switch W6 from the ground position to the power supply position. This, in effect, applies a voltage of −0.5000 volt to summing junction 7. This is shown by the arrow marked −0.5000 in the part of FIGURE 2 marked cycle 2. The summation at summing junction 7 of the input voltage of +0.4112 and the −0.5000 volt applied from the digital to analog converter 6 generates a voltage of −0.0888 at the summing junction 7. Thus, during cycle 2, comparator 9 does not generate an output signal on line 93. As a result of the absence of a signal on line 93 sequencing logic 8 resets position D1 to the ZERO state thereby resetting switch W6 to the ground position and at the same time sequencing logic 8 sets position D2 to the ONE state thereby transferring switch W5 to the power supply position. The settings of switches W5 and W6 are changed simultaneously. However, for ease and clarity in illustration in FIGURE 2, between cycles 2 and 3 in the line shows that first, the −0,5000 volt is removed from summing junction 7 returning the voltage at summing junction 7 to +0.4112 volt. Then, a voltage of −0.2500 volt is applied to summing junction 7 reducing the voltage at summing junction 7 to +0.1612 volt. In practice care is taken to insure that transient spikes do not occur between cycles. During cycle 3, comparator 9 will detect that the voltage on line 91 is more positive than the voltage on line 92 thereby generating an output on line 93 during cycle 3. In response to the signal on line 93 at the end of cycle 3, sequencing logic 8 will not reset bit position D2 to the ZERO state and it will set position D3 to the ONE state. The affect of setting bit position D3 to the ONE state will be, in effect, to add another voltage of −0.1250 volt to summing junction 7 thereby reducing the voltage at the summing junction 7 to +0.0362. Again, during cycle 4, comparator 9 will detect a positive voltage on line 91 and therefore generate a signal on line 93. In response to the signal on line 93 at the end of cycle 4, sequencing logic 8 will set bit position D4 to the ONE state. The effect of this will be to reduce the voltage at summing junction 7 by +0.0625 volt thereby making the voltage at summing junction 7 −0.0263 volt. Since the signal on line 91 will be negative, comparator 9 will not generate a signal on line 93 and at the end of cycle 5 sequencing logic 8 will reset position D4 of register 12 to the ZERO state and set position D5 to the ONE state. The sequence of operations continue until at the end of cycle 7 the number 0011010 is stored in register 12. The number 0011010 represents the binary equivalent of the input voltage of +0.4112 volt.

The conversion of a negative voltage will now be explained with reference to FIGURE 3. Furthermore, the reason that the number appearing in register 12 is the two's complement of the value of a negative input will be explained. FIGURE 3 shows the value of the voltage at summing junction 7 during the various cycles in the conversion of an input voltage of —0.5930. The conversion of a negative number takes place in seven cycles similar to the conversion of a positive number. Again, initially all of the positions in register 12 are set to the ZERO state and switch 103 is set to the ground position so that circuit 10 generates ZERO volts on line 92. When a negative input is applied to terminal 5, the signal on line 91 will be negative relative to the signal on line 92 during cycle 1; hence, comparator 9 will not generate an output signal during cycle 1. Sign circuitry 13 will respond to the absence of a signal on line 93 during cycle 1 and at the end of cycle 1 sign circuitry 93 will set the S bit in register 12 to the ONE state and sign circuitry 13 will change switch 103 from the ground position to the power supply position. Thus, at the beginning of cycle 2, circuit 10 will generate a reference voltage on line 93 of approximately minus one volt (referred to switch 103). At the beginning of cycle 2, sequencing logic 8 will set bit position D1 of register 12 to the ONE state thereby applying the voltage of —0.5000 to summing junction 7. The resulting voltage on line 91 will be the sum of the voltages from digital to analog converter 6 and the voltage applied to input 5 or —1.0930 volts. Thus, during cycle 2, comparator 9 will detect a negative voltage on line 91 relative to line 92 and at the end of cycle 2 sequencing logic 8 will reset bit position D1 to the ZERO state and said position D2 to the ONE state. The sequence of operations during the following six cycles are identical to the sequence described during the conversion of a positive number; however, since reference circuit 10 is generating a signal of minus one volt, the comparator 9 will generate an output whenever total voltage at summing junction 7 is more negative than minus one volt. The result will be that for an input voltage of —0.5930 volt at the end of the conversion cycle the number 1011010 will appear in register 12. The binary number 1011010 is the two's complement of the number 0100110 and the number 0100110 represents the magnitude of the voltage 0.5830 volt. Thus, the number appearing in register 12 at the end of the conversion sequence is the two's complement of the number that represents the magnitude of the input voltage.

As previously indicated, utilizing the present invention increases the accuracy, stability and linearity of the overall analog to digital converter. The fact that using the present invention increases the linearity between positive and negative inputs can be seen from the following example. If the reference source 11 becomes more negative and a positive analog input signal is applied to terminal 5, the digital value that is stored in register 12 at the end of the conversion will be lower than it should be. However, if the reference source 11 becomes more negative and a negative analog input signal is applied to terminal 5, the absolute magnitude of the digital value stored in register 12 at the end of the conversion will be higher than it should be. (This can be seen by examining the effect of moving the reference line in FIGURES 2 and 3 and noting where the crossings of the reference line occur. Since the number stored in register 12 due to a negative analog input is in two's complement form, if a negative analog input is applied to terminal 5 and the reference 11 becomes more negative than it should be the actual value represented by the digits in register 12 will be smaller than it should be. For example, if the reference source becomes more negative by one percent the resulting output from a positive analog input will be one percent higher than the true value and the resulting output from a negative analog input signal will also be one percent higher than the true value. Thus, there is greater linearity between positive and negative input signals.

Another advantage in using one precision power supply instead of two precision power supplies is that in a system which utilizes two precision reference supplies it is possible for one power supply to drift in one direction while the other power supply drifts in the opposite direction thereby resulting in cumulative errors. Furthermore, the reliability of the system is naturally increased by using merely one precision power supply rather than two precision power supplies since the elimination of parts in general increases reliability of a system unless other factors counterbalance the increase in reliability.

As shown herein, the system includes voltage reference sources and a voltage ladder network. Naturally, a similar system utilizing the present invention could be designed using current sources rather than voltage sources. In this instance, both circuit 10 and switches 16 would switch constant current sources, precision power supply 11 would provide a constant current output and network 15 would be a current ladder network. The switching circuitry used could be similar to that shown in a publication entitled "Current Switching in ADC Systems" by H. Ottesen published in Volume 7, No. 11, April 1965 of the IBM Technical Disclosure Bulletin, and in "Precision Current Sources Independent of Supply Voltage" by H. Ottesen published in volume 7, No. 1, March 1965, page 8747 of the IBM Technical Disclosure Bulletin.

It should further be appreciated that the present invention eliminates the need for two precision power supplies; however, this does not mean that the circuit would not include other sources of power necessary for various other functions. However, the important fact is that these would not be precision reference sources. They might, for example, be collector supply voltages in comparator 9 and register 12. These sources need not necessarily have a high degree of accuracy.

Comparator 9, together with circuit 10, could be described as a detector which detects the presence of certain predetermined voltages at summing junction 7.

While the invention has been particularly shown and described with reference to preferred embodiments thereof, it will be understood by those skilled in the art that the foregoing and other changes in the form and details may be made therein without departing from the spirit and scope of the invention.

What is claimed is:

1. A successive approximation type of analog to digital converter including:

input means for receiving an analog signal;

a register for storing a binary number;

a digital to analog converter for converting the binary number stored in said register to an analog signal, said digital to analog converter including a ladder network;

a precision power supply for generating a negative voltage;

means for connecting the legs of said ladder network to either ground potential or to the output of said precision power supply in response to the number stored in said register;

a summing junction for summing said input signal and the output of said digital to analog converter;

a comparator having two inputs, said first input being connected to said summing junction;

a circuit connected to the second input of said comparator, said circuit having two states: in said first state said circuit generating an output of substantially ground potential and in said second state said circuit generating a negative output, said circuit utilizing said precision power supply as a reference;

sequencing logic responsive to the output of said comparator for changing the number stored in said register until said comparator indicates that the voltage at said summing junction substantially equals the voltage generated by said circuit;

means for placing said circuit in said first state when a negative voltage is applied to said input and means for placing said circuit in said second state when the second voltage is applied to said input, whereby the number finally appearing in said register represents the binary value of said input voltage when a positive voltage is applied to said input and whereby the number finally appearing in said register represents the two's complement of the signal applied to said input when a negative signal is applied to said input.

2. A successive approximation type of analog to digital converter for converting input signals having a first and a second opposite polarity that includes:

input means for receiving an analog input signal;

register means for storing a binary number;

a digital to analog converter for converting the binary number stored in said register to an analog signal;

a first reference source for said digital to analog converter, said reference source having a first polarity;

a summing junction for summing said input signal and the output of said digital to analog converter;

a comparator having two inputs, said first input being connected to said summing junction;

sequencing logic for changing the binary number stored in said register until said comparator detects no voltage between said inputs;

means connected to said second input of said comparator for applying substantially zero level signal to said second input when a signal having a polarity opposite to said first polarity is applied to said input means, and utilizing the output of said first reference source for applying a signal having said first polarity to said second input when a signal of said first polarity is applied to said input means.

3. A bipolar successive approximation type of analog to digital converter that includes:

input means for receiving an analog input signal;

register means for storing a binary number;

a digital to analog converter for converting the binary number stored in said register to an analog signal;

a precision reference power supply, the output of which has a first polarity, said power supply providing a reference for said digital to analog converter;

a summing junction for summing said input signal and the output of said digital to analog converter;

a detector for detecting the voltage between said summing junction and a predetermined voltage;

sequencing logic for changing the binary number stored in said register until said detector detects no difference between the voltage at said summing junction and said predetermined voltage;

means for supplying a first predetermined voltage derived from said precision reference power supply to said detector for converting analog input signals of said first polarity and for supplying a second predetermined reference of substantially zero level to said detector for converting signals having the opposite polarity to said first polarity.

4. A successive approximation type of analog to digital converter including:

input means for receiving an analog signal;

a register for storing a binary number;

a digital to analog converter for converting the binary number stored in said register to an analog signal, said digital to analog converter inclulding a ladder network;

a precision power supply for generating a reference having a first polarity;

means for connecting the legs of said ladder network to either a zero reference or to the output of said precision power supply in response to the number stored in said register;

a summing junction for summing said input signal and the output of said digital to analog converter;

a comparator having two inputs, said first input being connected to said summing junction;

a circuit connected to the second input of said comparator, said circuit having two states: in said first state said circuit generating a zero level output signal and in said second state said circuit generating an output of said first polarity, said circuit utilizing said precision power supply as a reference source;

sequencing logic responsive to the output of said comparator for changing the number stored in said register until said comparator indicates that the signal at said summing junction substantially equals the signal generated by said circuit;

means for placing said circuit in said first state when a signal having a polarity opposite to said first polarity is applied to said input and means for placing said circuit in said second state when a signal having said first polarity is applied to said input, whereby the number finally appearing in said register represents the binary value of said input signal when a signal having a polarity opposite to said first polarity is applied to said input and whereby the number finally appearing in said register represents the two's complement of the signal applied to said input when a signal having said first polarity is applied to said input.

References Cited

UNITED STATES PATENTS

| | | | |
|---|---|---|---|
| 3,016,528 | 1/1962 | Villars | 340—347 |
| 3,182,304 | 5/1965 | Beck et al. | 340—347 |
| 3,234,544 | 2/1966 | Marenholtz | 340—347 |

MAYNARD R. WILBUR, Primary Examiner

C. D. MILLER, Assistant Examiner